US006360611B1

(12) United States Patent
Toda

(10) Patent No.: US 6,360,611 B1
(45) Date of Patent: Mar. 26, 2002

(54) DEVICE FOR ULTRASOUND RADIATION INTO A MATERIAL

(76) Inventor: Kohji Toda, 1-49-18 Futaba, Yokosuka 239-0814 (JP)

( * ) Notice: Subject to any disclaimer, the term of this patent is extended or adjusted under 35 U.S.C. 154(b) by 0 days.

(21) Appl. No.: 09/557,042

(22) Filed: Apr. 21, 2000

(51) Int. Cl.[7] .......................... G01D 21/00; H01L 41/04

(52) U.S. Cl. ...................................... 73/651; 310/313 B

(58) Field of Search .......................... 73/651, 649, 570; 310/313 B, 321, 322, 334, 365; 367/157, 164

(56) References Cited

U.S. PATENT DOCUMENTS

| | | | | |
|---|---|---|---|---|
| 6,079,274 A | * 6/2000 | Ando et al. | .................... | 73/649 |
| 6,094,988 A | * 8/2000 | Aindow | ........................ | 73/649 |
| 6,142,948 A | * 11/2000 | Toda | .......................... | 600/459 |
| 6,317,389 B1 | * 11/2001 | Toda | .......................... | 367/164 |

* cited by examiner

*Primary Examiner*—Richard A. Moller

(57) ABSTRACT

A device for ultrasound radiation into a material comprises a piezoelectric substrate, a first input interdigital transducer, a second input interdigital transducer, an output interdigital transducer, an amplifier, and a voltage controller. All the interdigital transducers are formed on one end surface of the piezoelectric substrate. If an input electric signal is applied to the first input interdigital transducer, a first elastic wave is excited in the piezoelectric substrate. A non-leaky component of the first elastic wave is transmitted to the output interdigital transducer, and detected at the output interdigital transducer as a delayed electric signal, which is amplified via the amplifier. A signal part of an amplified electric signal is fed back to the first input interdigital transducer, again. A remaining signal part of the amplified electric signal is applied to the second input interdigital transducer via the voltage controller, where a voltage of the remaining signal part is controlled, In this time, a second elastic wave is excited in the piezoelectric substrate. A leaky component of the second elastic wave is radiated effectively in the form of a longitudinal wave, by an intensity corresponding to the voltage of the remaining signal part, into a material kept in contact with the other end surface of the piezoelectric substrate.

14 Claims, 11 Drawing Sheets

DEVICE FOR ULTRASOUND RADIATION INTO A MATERIAL

BACKGROUND OF THE INVENTION

1. Field of the Invention

The present invention relates to a device for radiating an ultrasound into a material by means of using an assembly composed of a piezoelectric substrate, a first input-, a second input-, and an output interdigital transducers.

2. Description of the Prior Art

In constructing an acoustical system, a transducer for emitting and detecting an acoustic wave has a key role. A thickness mode piezoelectric transducer is usually used, whose operation frequency is dependent on the thickness of the piezoelectric substrate. Such a conventional type of transducer has a difficulty in high-frequency operation. A surface acoustic wave (SAW) propagates in the form of a leaky wave, when the piezoelectric substrate, sufficiently thicker compared with the wavelength, is in contact with a liquid. In this time, the leaky wave is mode-converted to a longitudinal wave into the liquid. This means that an interdigital transducer (IDT) on the piezoelectric substrate operates at a liquid-solid boundary as a leaky wave transducer for bulk wave radiation into the liquid. The leaky SAW traveling on a sufficiently thick substrate compared with the wavelength has only one mode without velocity dispersion. Thus, conventional transducers such as the thickness mode piezoelectric transducer and the IDT for the leaky SAW have the problem of the limited ultrasound-radiation angle.

SUMMARY OF THE INVENTION

An object of the present invention is to provide a device for ultrasound radiation into a material capable of a multi-modes operation and a high efficiency at a high frequency.

Another object of the present invention is to provide a device for ultrasound radiation into a material capable of adjusting ultrasound power.

Another object of the present invention is to provide a device for ultrasound radiation into a material capable of adjusting radiation angle θ.

Another object of the present invention is to provide a device for ultrasound radiation into a material capable of sweeping ultrasound beam.

Another object of the present invention is to provide a device for ultrasound radiation into a material capable of a low electric power consumption.

Another object of the present invention is to provide a device for ultrasound radiation into a material capable of radiating an ultrasound into a cellular tissue.

Another object of the present invention is to provide a device for ultrasound radiation into a material excellent in durability and manufacturing.

Another object of the present invention is to provide a device for ultrasound radiation into a material which is not affected by a change in circumstances, for example, a change in temperature.

A still other object of the present invention is to provide a device for ultrasound radiation into a material easy in use and having a small size which is very light in weight and has a simple structure.

According to one aspect of the present invention there is provided a device for ultrasound radiation into a material comprising a piezoelectric substrate, a first input interdigital transducer, a second input interdigital transducer, an output interdigital transducer, an amplifier, and a voltage controller. All the interdigital transducers are formed on one end surface of the piezoelectric substrate.

If an input electric signal is applied to the first input interdigital transducer, a first elastic wave, composed of a leaky- and a non-leaky components, is excited in the piezoelectric substrate. A non-leaky component of the first elastic wave is transmitted to the output interdigital transducer, and detected at the output interdigital transducer as a delayed electric signal, which is amplified via the amplifier. A signal part of an amplified electric signal is fed back, as the input electric signal, to the first input interdigital transducer, again. A remaining signal part of the amplified electric signal is transmitted to the voltage controller, where a voltage of the remaining signal part is controlled, and then, the remaining signal part is applied to the second input interdigital transducer. In this time, a second elastic wave, composed of a leaky- and a non-leaky components, is excited in the piezoelectric substrate. The leaky component of the second elastic wave is radiated effectively in the form of a longitudinal wave, by an intensity corresponding to the voltage of the remaining signal part, into a material kept in contact with the other end surface of the piezoelectric substrate. Thus, it is possible to adjust an ultrasound power into the material.

According to another aspect of the present invention there is provided a piezoelectric substrate made of a piezoelectric ceramic thin plate, the polarization axis thereof being parallel to the thickness direction thereof. Thus, the elastic wave is effectively excited in the piezoelectric substrate.

According to another aspect of the present invention there is provided a piezoelectric substrate made of a piezoelectric polymer thin plate. Thus, the elastic wave is effectively excited in the piezoelectric substrate.

According to another aspect of the present invention there is provided a filter for adjusting a frequency of the input electric signal. A radiation angle θ into the material depends on an operation frequency. Therefore, it is possible to adjust the radiation angle θ into the material.

According to another aspect of the present invention there is provided a polymer film, with which at least a surface part of the other end surface of the piezoelectric substrate is coated. The surface part corresponds to a surface part, including the second input interdigital transducer, of the one end surface of the piezoelectric substrate. Owing to the existence of the polymer film, the longitudinal wave is effectively radiated into the material in contact with an outside surface of the polymer film.

According to other aspect of the present invention there is provided a cap mounted on a surface part, in contact with air, of the other end surface of the piezoelectric substrate. The surface part corresponds to a surface part, including the first input- and the output interdigital transducers, of the one end surface of the piezoelectric substrate. Owing to the existence of the cap, the non-leaky component of the first elastic wave is effectively excited in the piezoelectric substrate, and then transmitted to the output interdigital transducer. Thus, the use of the cap causes a more effective self-oscillation.

According to a further aspect of the present invention there are provided a switch and an input interdigital-transducer group, which is in place of the second input interdigital transducer. The input interdigital-transducer group consists of at least two interdigital transducers, which are connected with the voltage controller in turn via the switch. When the remaining signal part of the amplified electric signal is applied to these interdigital transducers in turn, the leaky component of the second elastic wave is excited, in turn, in zone parts, in the vicinities of these interdigital transducers, respectively, of the piezoelectric substrate. Thus, the leaky component of the second elastic wave is effectively radiated, in turn, in the form of a longitudinal wave into the material. Thus, it is possible to sweep an ultrasound beam into the material.

BRIEF DESCRIPTION OF THE DRAWINGS

Other features and advantages of the invention will be clarified from the following description with reference to the attached drawings.

DETAILED DESCRIPTION OF THE PRESENTLY PREFERRED EXEMPLARY EMBODIMENTS

Figure 1:
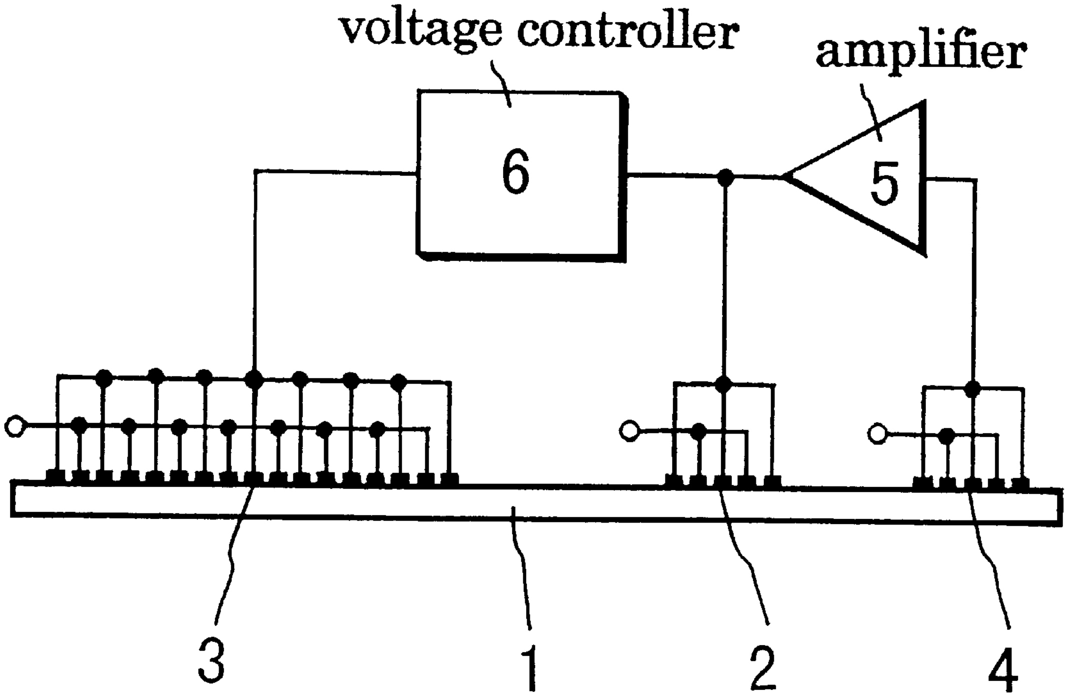
FIG. 1 shows a schematic illustration of a device for ultrasound radiation into a material according to a first embodiment of the present invention.

FIG. 1 shows a schematic illustration of a device for ultrasound radiation into a material according to a first embodiment of the present invention. The device for ultrasound radiation into a material comprises piezoelectric substrate 1, first input interdigital transducer 2, second input interdigital transducer 3, output interdigital transducer 4, amplifier 5, and voltage controller 6. Piezoelectric substrate 1 is made of a piezoelectric ceramic thin plate with a dimension of 218 μm in thickness. It is possible to use a piezoelectric polymer thin plate as piezoelectric substrate 1. First input interdigital transducer 2, second input interdigital transducer 3, and output interdigital transducer 4, made of an aluminum thin film, respectively, are formed on one end surface of piezoelectric substrate 1. Thus, the device for ultrasound radiation into a material in FIG. 1 has a small size which is very light in weight and has a simple structure.

Figure 2:
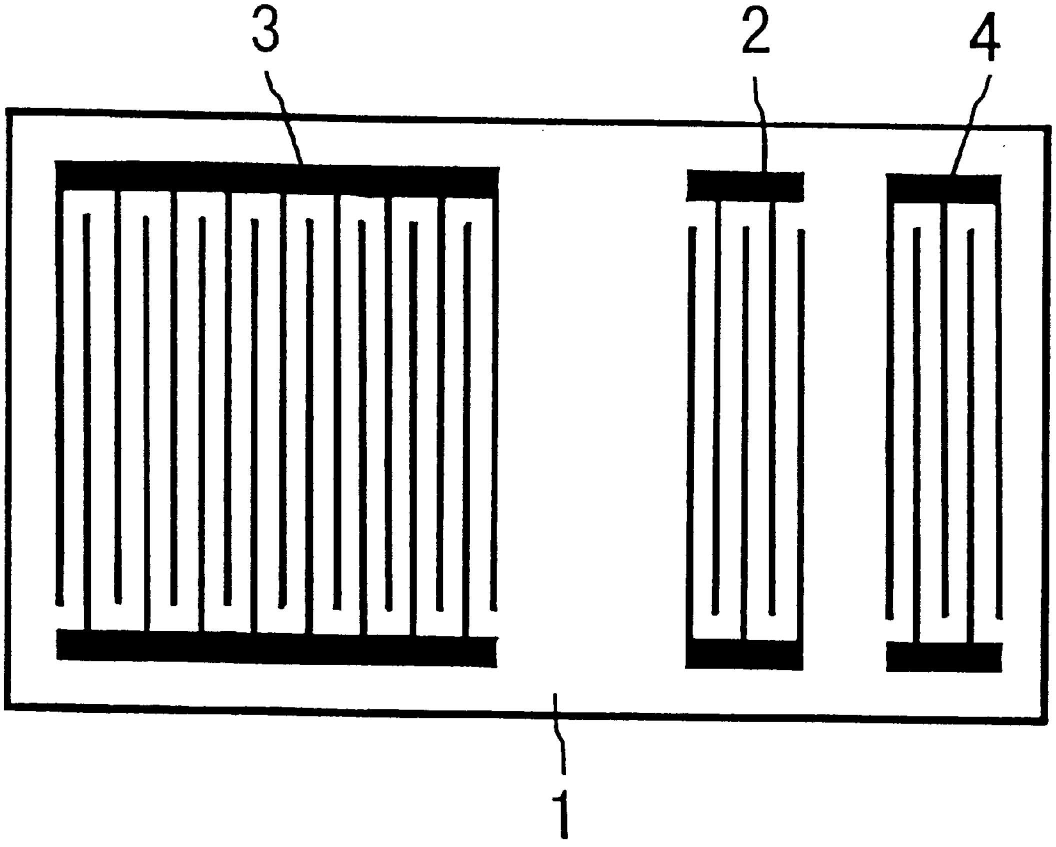
FIG. 2 shows a top plan view of an assembly composed of piezoelectric substrate 1, first input interdigital transducer 2, second input interdigital transducer 3, and output interdigital transducer 4, shown in FIG. 1.

FIG. 2 shows a top plan view of an assembly composed of piezoelectric substrate 1, first input interdigital transducer 2, second input interdigital transducer 3, and output interdigital transducer 4, shown in FIG. 1. First input interdigital transducer 2, second input interdigital transducer 3, and output interdigital transducer 4 have an interdigital periodicity of 430 μm, respectively. First input interdigital transducer 2 and output interdigital transducer 4 have 5 electrode-finger pairs, respectively. Second input interdigital transducer 3 has 60 electrode-finger pairs.

In the device for ultrasound radiation into a material in FIG. 1, if an input electric signal is applied to first input interdigital transducer 2, a first elastic wave, composed of a leaky- and a non-leaky components, is excited in piezoelectric substrate 1. Because piezoelectric substrate 1 is made of a piezoelectric ceramic, and in addition, the polarization axis thereof is parallel to the thickness direction thereof, the first elastic wave is excited in piezoelectric substrate 1 effectively. The non-leaky component of the first elastic wave is transmitted to output interdigital transducer 4, and detected at output interdigital transducer 4 as a delayed electric signal, which is amplified via amplifier 5. A signal part of an amplified electric signal via amplifier 5 is fed back, as the input electric signal, to first input interdigital transducer 2, again. Thus, first input interdigital transducer 2, output interdigital transducer 4, and amplifier 5 form a self-oscillation type of delay-line oscillator. On the other hand, a remaining signal part of the amplified electric signal is transmitted to voltage controller 6, and a voltage of the remaining signal part is controlled by voltage controller 6. And then, the remaining signal part is applied to second input interdigital transducer 3. In this time, a second elastic wave, composed of a leaky- and a non-leaky components, is excited in piezoelectric substrate 1.

The leaky component of the second elastic wave is radiated effectively in the form of a longitudinal wave, by an intensity corresponding to the voltage of the remaining signal part, into a material, for example, a cellular tissue, kept in contact with the other end surface of piezoelectric substrate 1. Thus, it is possible to adjust an ultrasound power into the material.

Figure 3:
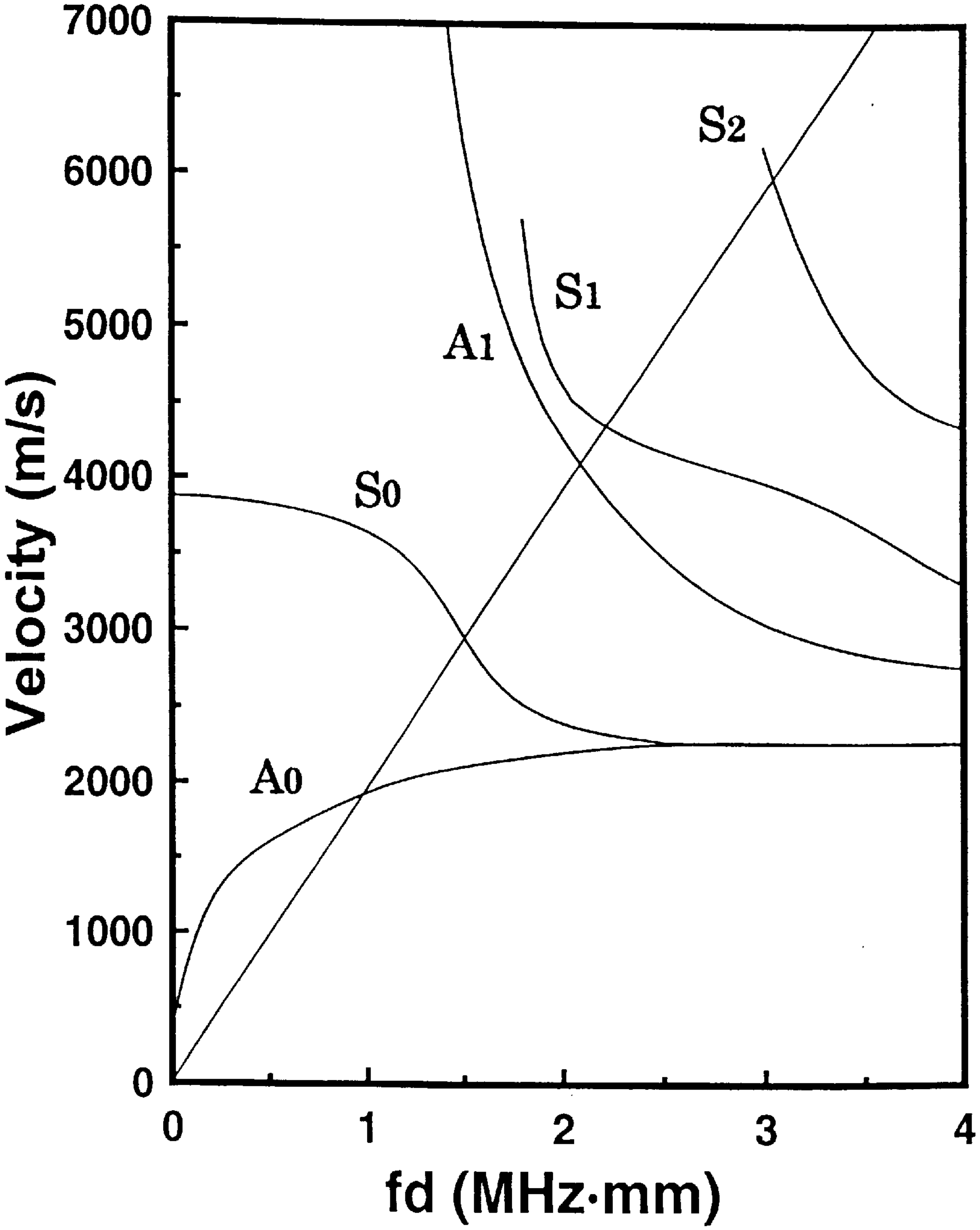
FIG. 3 shows a relationship between the phase velocity V of an elastic wave for each mode in piezoelectric substrate 1, and the product fd.

FIG. 3 shows a relationship between the phase velocity V of an elastic wave for each mode in piezoelectric substrate 1, and the product fd, where f is a frequency of the elastic wave and d is the thickness of piezoelectric substrate 1. Piezoelectric substrate 1 has a shear wave velocity of 2,450 m/s and a longitudinal wave velocity of 4,390 m/s. It should be noted that a multi-modes operation is available. In addition, under a higher-order mode operation, a higher velocity brings about a smaller radiation angle θ into the material. The radiation angle θ satisfies the relation of $\theta=\sin^{-1} Vm/V$, where Vm is the longitudinal velocity in the material. As a result, the higher frequency operation, the smaller radiation angle θ.

Figure 4:
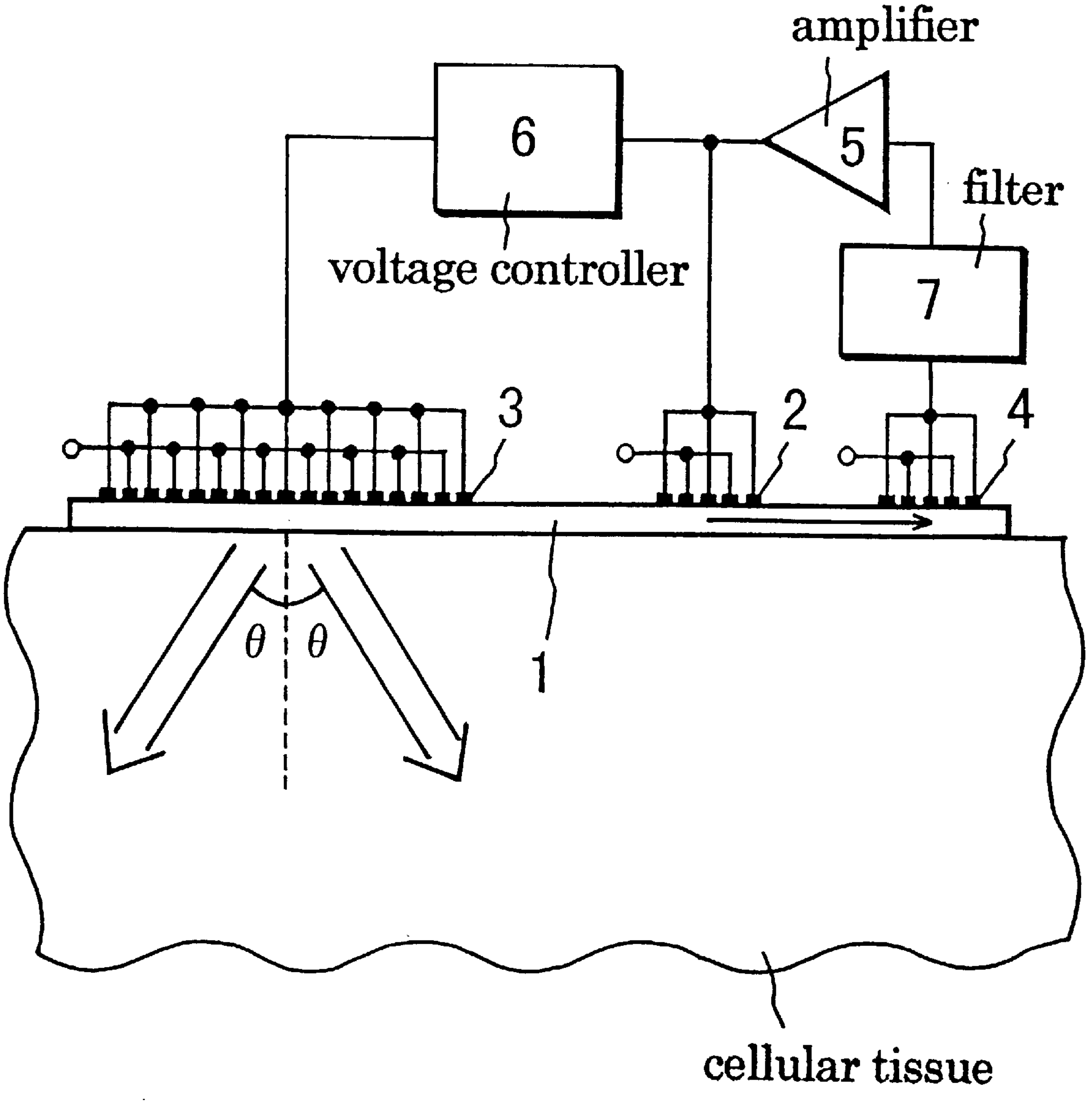
FIG. 4 shows a schematic illustration of a device for ultrasound radiation into a material according to a second embodiment of the present invention.

FIG. 4 shows a schematic illustration of a device for ultrasound radiation into a material according to a second embodiment of the present invention. In FIG. 4, a path of the longitudinal wave traveling in a material, for example a cellular tissue, kept in contact with the other end surface of piezoelectric substrate 1, is also shown by an arrow. The device for ultrasound radiation into a material has the same construction as FIG. 1, except for further comprising filter 7 for adjusting an operation frequency. As mentioned in FIG. 3, the radiation angle θ depends on the operation frequency.

Thus, it is possible to adjust not only the ultrasound power but also the radiation angle θ into the material.

Figure 5:
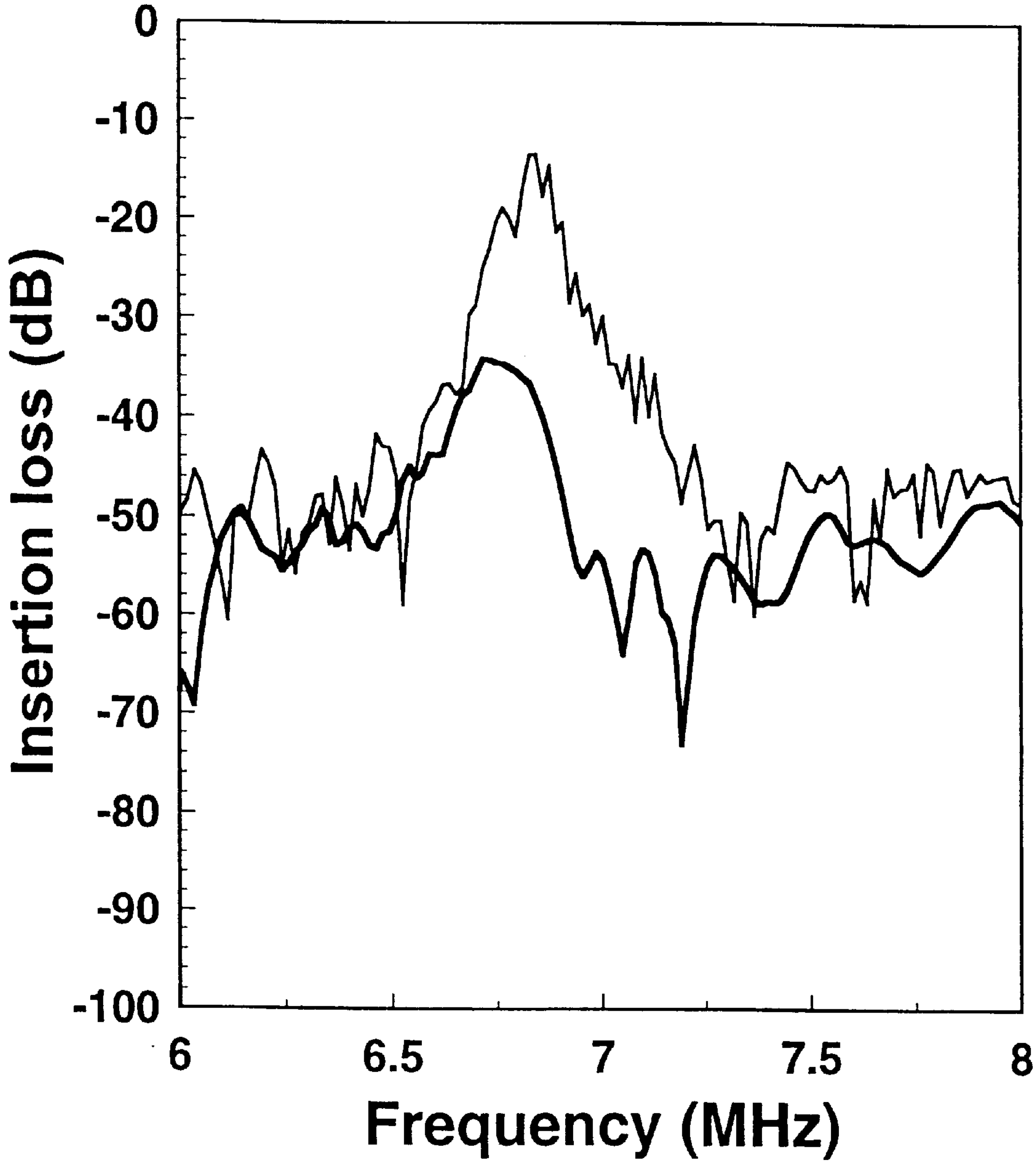
FIG. 5 shows a relationship between the insertion loss of an elastic wave in piezoelectric substrate 1 alone, and the frequency ranging 6–8 MHz.

FIG. 5 shows a relationship between the insertion loss of an elastic wave in piezoelectric substrate 1 alone, and the frequency ranging 6–8 MHz. A thin- and a thick lines correspond to a condition loaded with nothing and that loaded with water, on the other end surface of piezoelectric substrate 1, respectively. It should be noted that a difference in insertion loss, between the condition loaded with nothing and that loaded with water, is the greatest at approximately 6.8 MHz. In addition to the difference at approximately 6.8 MHz, large differences at approximately 4.3, 9.5, 14.4, and 19 MHz, respectively, are observed. This means that operations at these frequencies, respectively, are suitable for radiating the longitudinal wave, at second input interdigital transducer 3, into the material kept in contact with the other end surface of piezoelectric substrate 1.

Figure 6:
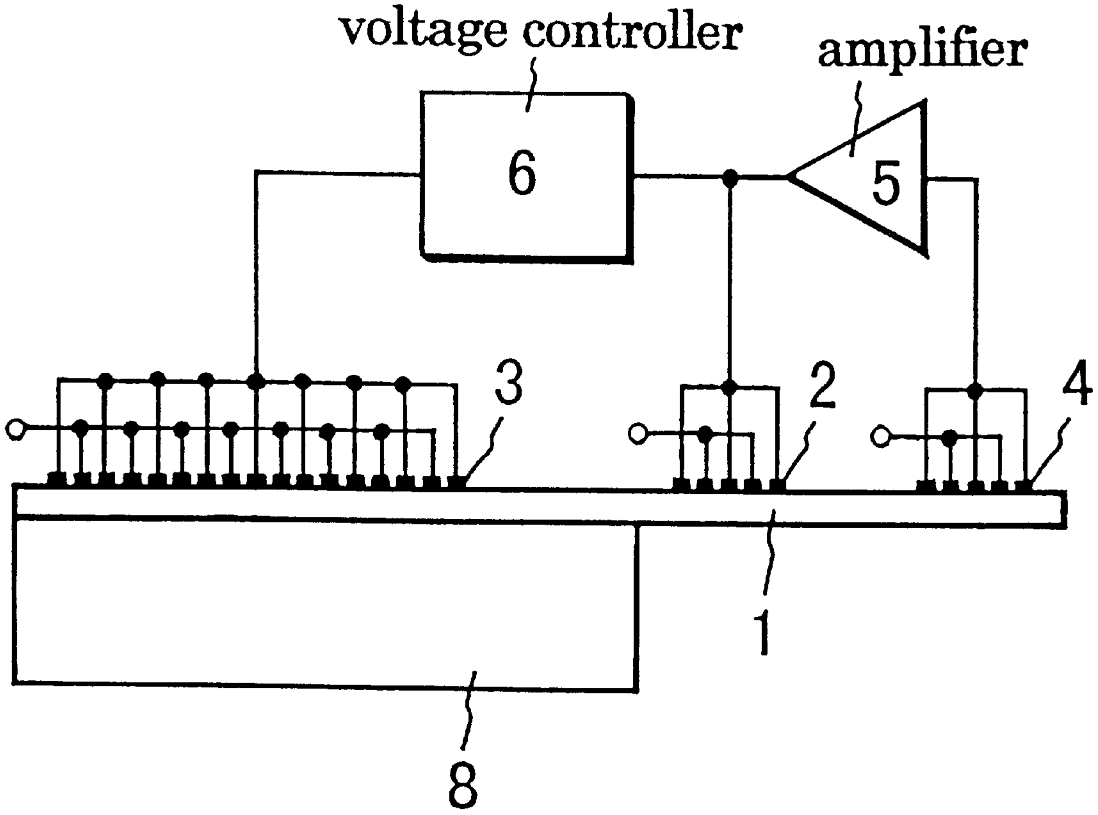
FIG. 6 shows a schematic illustration of a device for ultrasound radiation into a material according to a third embodiment of the present invention.

FIG. 6 shows a schematic illustration of a device for ultrasound radiation into a material according to a third embodiment of the present invention. The device for ultrasound radiation into a material has the same construction as FIG. 1, except for further comprising polymer film 8, with which a surface part of the other end surface of piezoelectric substrate 1, is coated. The surface part corresponds to a surface part, including second input interdigital transducer 3, of the one end surface of piezoelectric substrate 1. Polymer film 8, with a dimension of 1 mm in thickness, is made of a silicone rubber film, which excels in acoustic-impedance matching, Thus, the longitudinal wave is effectively radiated into a material such as a cellular tissue through an outside surface of polymer film 8.

Figure 7:
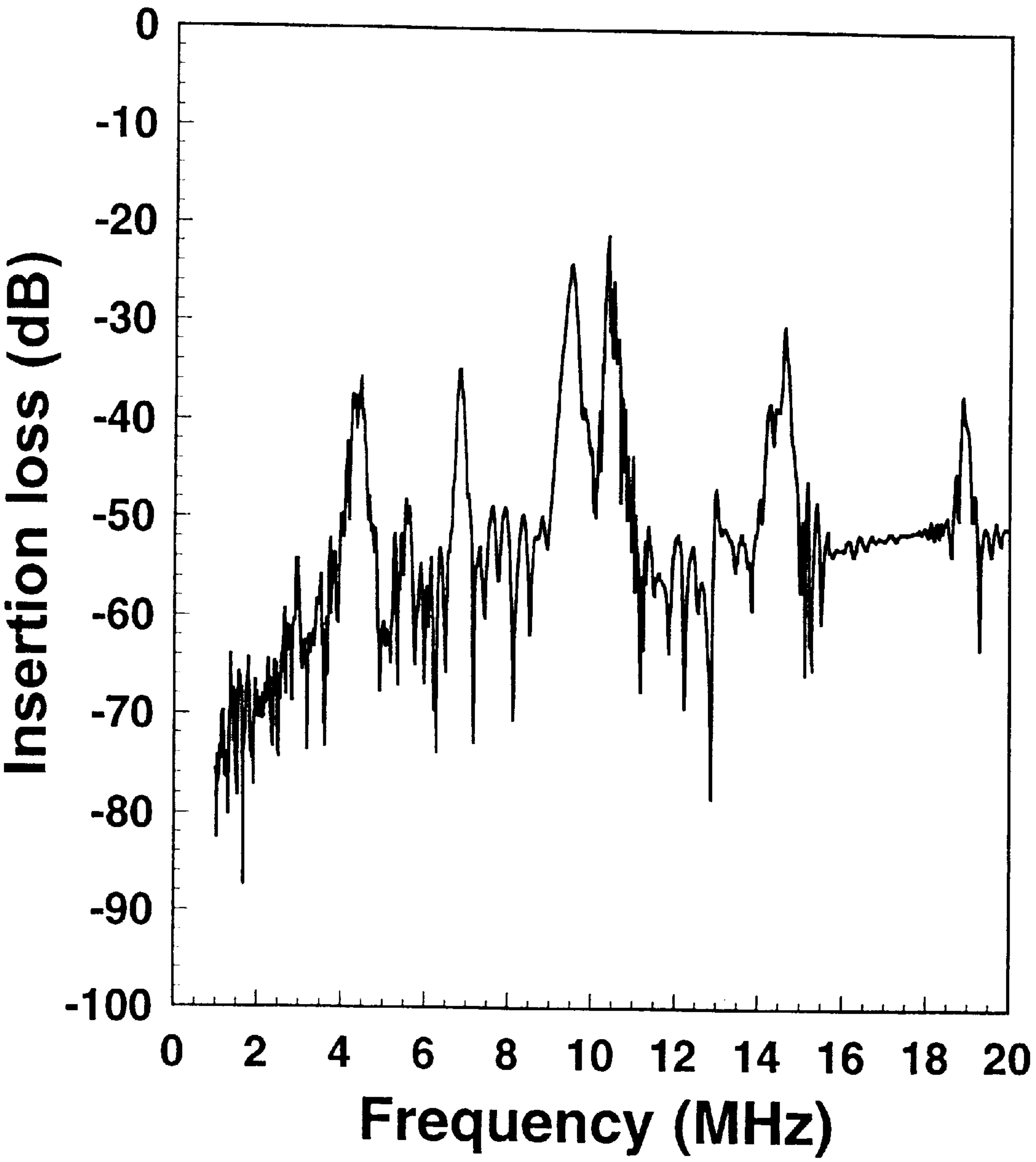
FIG. 7 shows a relationship between the frequency and the insertion loss of an elastic wave in a double-layer body composed of piezoelectric substrate 1 and polymer film 8.

FIG. 7 shows a relationship between the frequency and the insertion loss of an elastic wave in a double-layer body composed of piezoelectric substrate 1 and polymer film 8, of which the outside surface is in a condition loaded with water.

Figure 8:
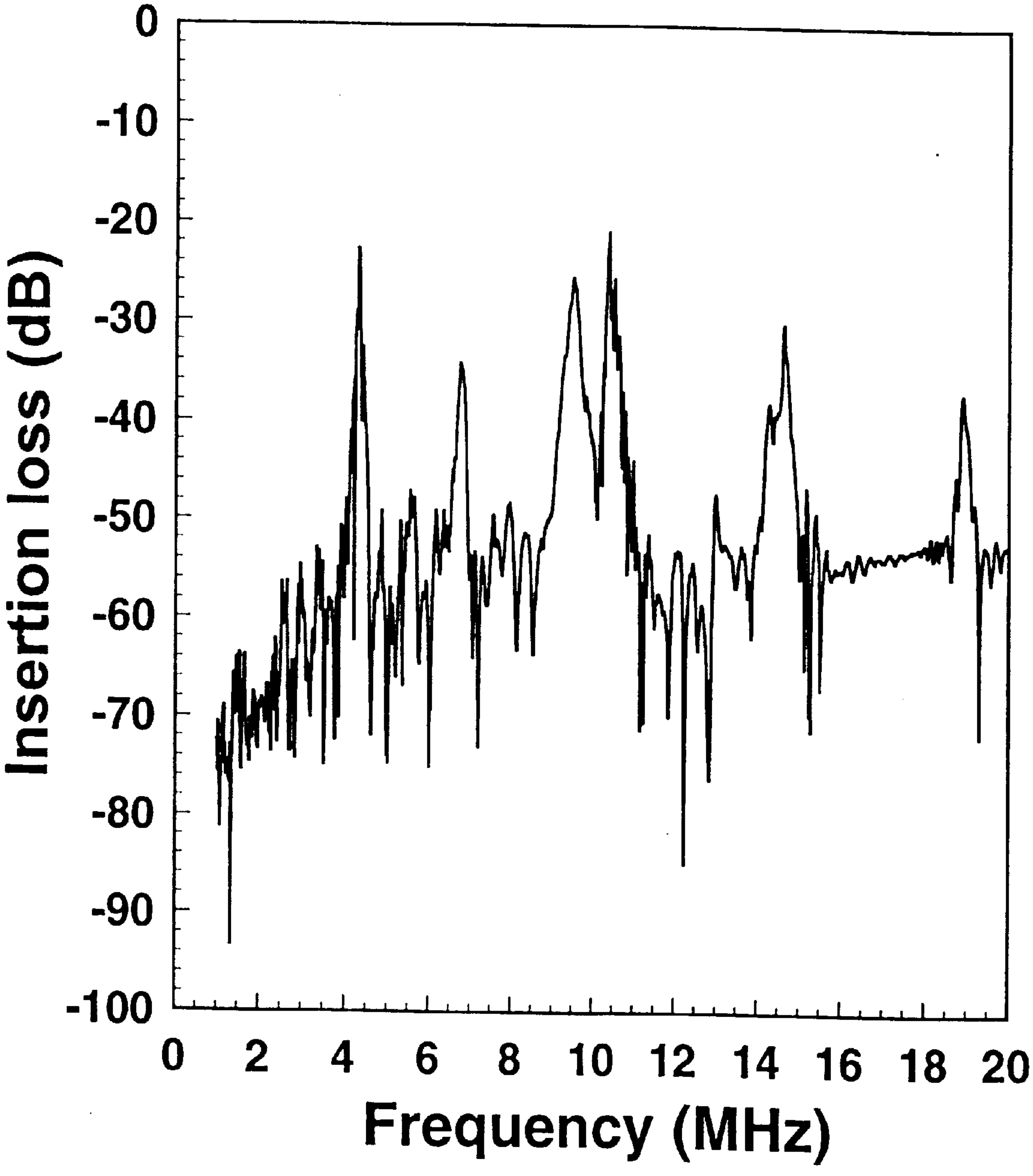
FIG. 8 shows a relationship between the frequency and the insertion loss of the elastic wave in the double-layer body composed of piezoelectric substrate 1 and polymer film 8.

FIG. 8 shows a relationship between the frequency and the insertion loss of the elastic wave in the double-layer body composed of piezoelectric substrate 1 and polymer film 8, of which the outside surface is in a condition loaded with nothing.

It is clear from FIGS. 7 and 8 that a difference in insertion loss, between the condition loaded with nothing and that loaded with water, is the greatest at approximately 4.3 MHz. This means that an operation at this frequency is suitable for radiating the longitudinal wave, at second input interdigital transducer 3, into the material.

Figure 9:
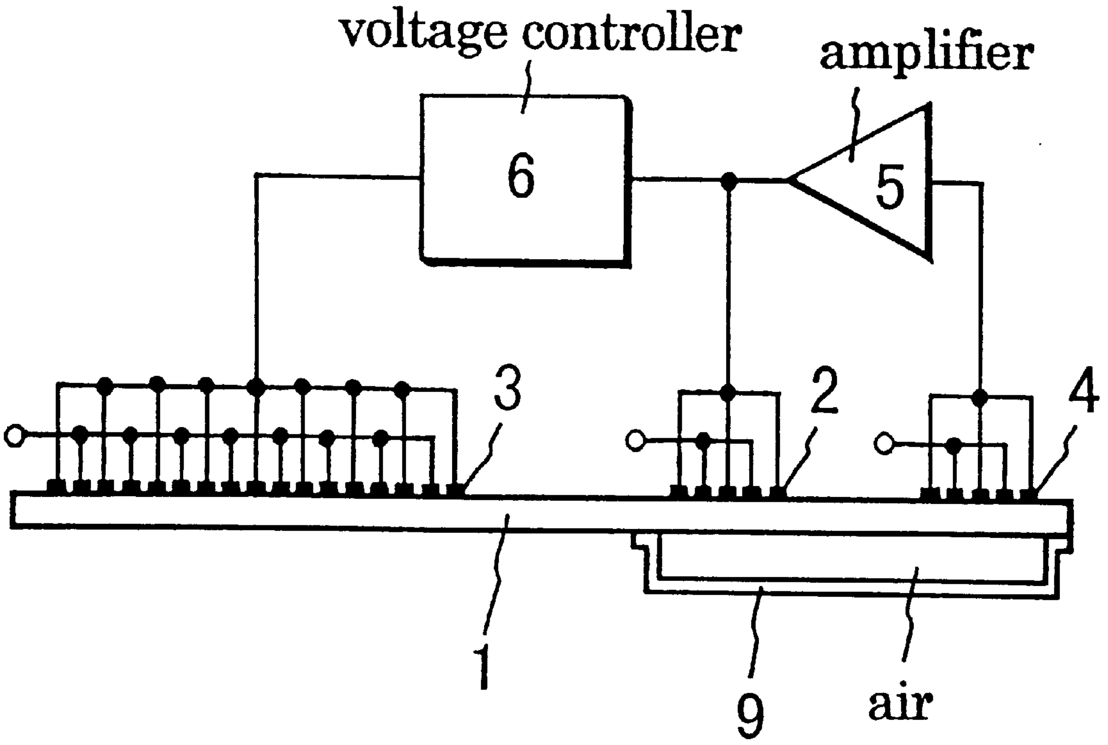
FIG. 9 shows a schematic illustration of a device for ultrasound radiation into a material according to a fourth embodiment of the present invention.

FIG. 9 shows a schematic illustration of a device for ultrasound radiation into a material according to a fourth embodiment of the present invention. The device for ultrasound radiation into a material has the same construction as FIG. 1, except for further comprising cap 9 mounted on a surface part of the other end surface of piezoelectric substrate 1. The surface part of the other end surface of piezoelectric substrate 1, in contact with air, corresponds to a surface part, including first input interdigital transducer 2 and output interdigital transducer 4, of the one end surface of piezoelectric substrate 1. Thus, when the input electric signal is applied to first input interdigital transducer 2, the non-leaky component of the first elastic wave is effectively excited in piezoelectric substrate 1, and then transmitted to output interdigital transducer 4. As a result, the use of cap 9 causes a more effective self-oscillation.

Figure 10:
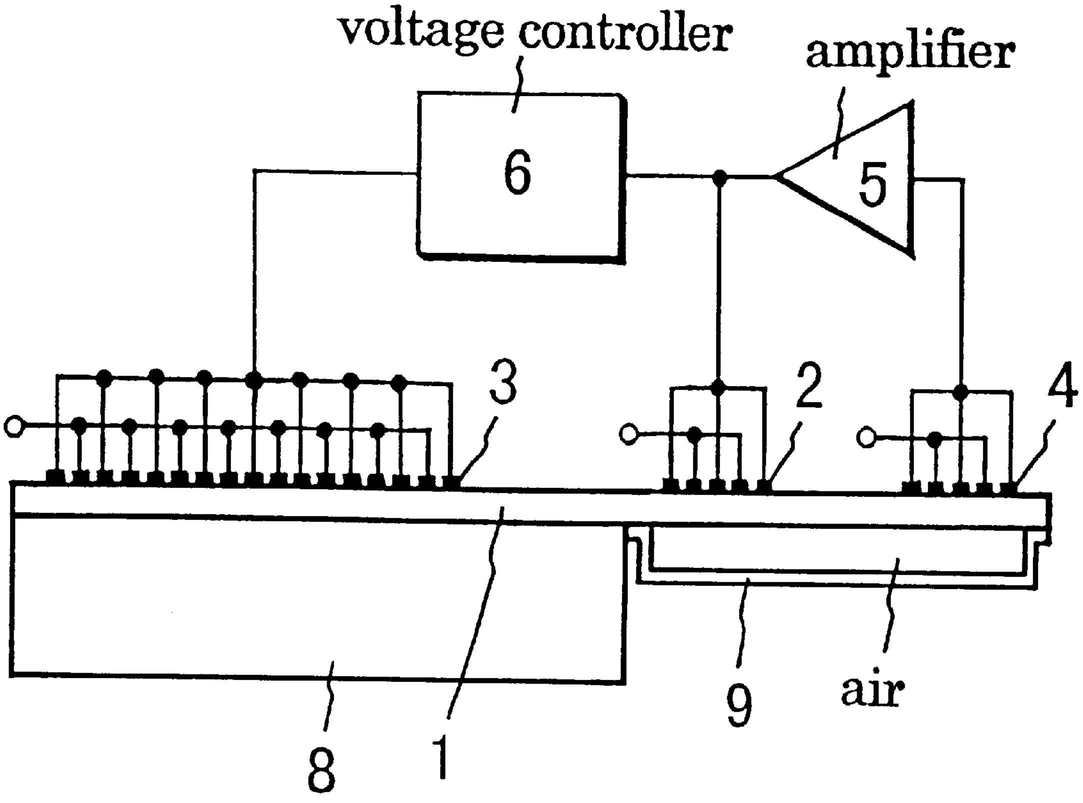
FIG. 10 shows a schematic illustration of a device for ultrasound radiation into a material according to a fifth embodiment of the present invention.

FIG. 10 shows a schematic illustration of a device for ultrasound radiation into a material according to a fifth embodiment of the present invention. The device for ultrasound radiation into a material has the same construction as FIG. 1, except for further comprising polymer film 8 and cap 9. In FIG. 10, a surface part of the other end surface of piezoelectric substrate is coated with polymer film 8. The surface part corresponds to a surface part, including second input interdigital transducer 3, of the one end surface of piezoelectric substrate 1. Cap 9 is mounted on a remaining surface part of the other end surface of piezoelectric substrate 1. Thus, when the input electric signal is applied to first input interdigital transducer 2, the non-leaky component of the first elastic wave is effectively excited in piezoelectric substrate 1, and then transmitted to output interdigital transducer 4. As a result, the use of cap 9 causes a more effective self-oscillation. In addition, the use of polymer film 8 causes a more effective radiation into a material.

Figure 11:
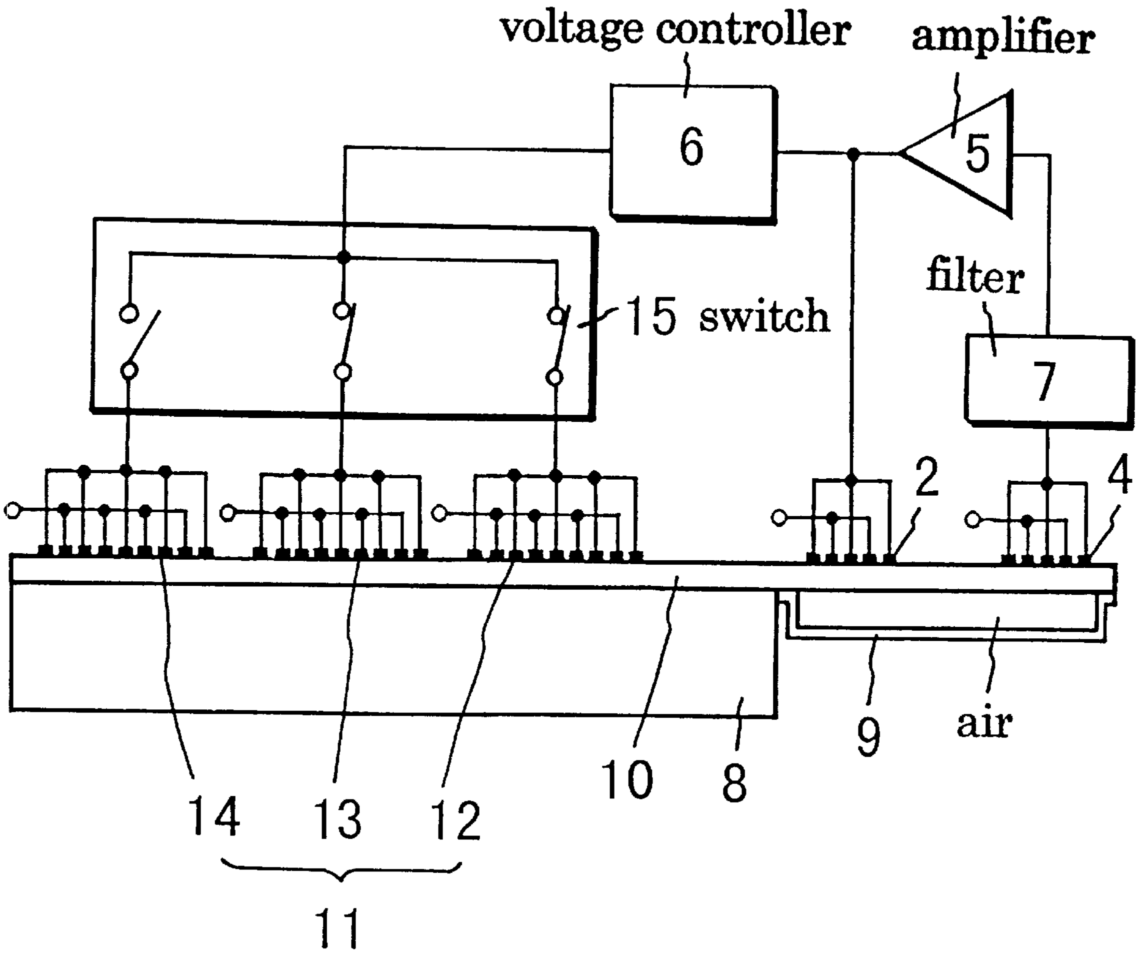
FIG. 11 shows a schematic illustration of a device for ultrasound radiation into a material according to a sixth embodiment of the present invention.

FIG. 11 shows a schematic illustration of a device for ultrasound radiation into a material according to a sixth embodiment of the present invention. The device for ultrasound radiation into a material comprises first input interdigital transducer 2, output interdigital transducer 4, amplifier 5, voltage controller 6, filter 7, polymer film 8, cap 9, piezoelectric substrate 10, input interdigital-transducer group 11 consisting of interdigital transducers 12, 13 and 14, and switch 15. Piezoelectric substrate 10 is made of a piezoelectric ceramic thin plate with a dimension of 218 μm in thickness. Input interdigital transducers 12, 13 and 14, made of an aluminum thin film, respectively, are formed on one end surface of piezoelectric substrate 10.

In the device for ultrasound radiation into a material in FIG. 11, when an input electric signal is applied to first input interdigital transducer 2, a non-leaky component of a first elastic wave is effectively excited in piezoelectric substrate 10 owing to the existence of cap 9, and then detected at output interdigital transducer 4 as a delayed electric signal, of which a frequency is adjusted via filter 7. The delayed electric signal is amplified via amplifier 5. A signal part of an amplified electric signal is fed back, as the input electric signal, to first input interdigital transducer 2, again. As a result, the use of cap 9 causes a more effective self-oscillation. A remaining signal part of the amplified electric signal is transmitted to voltage controller 6, in which a voltage of the remaining signal part is controlled. And then, the remaining signal part is applied to input interdigital-transducer group 11 via switch 15, which connects voltage controller 6 with interdigital transducers 12, 13 and 14, in turn. Thus, the remaining signal part is applied to interdigital transducers 12, 13 and 14, in turn, so that a leaky component of a second elastic wave is excited, in turn, in three zone parts, in the vicinities of interdigital transducers 12, 13 and 14, respectively, of piezoelectric substrate 10. Owing to the existence of polymer film 8, which excels in acoustic-impedance matching, the leaky component of the second elastic wave is effectively radiated, in turn, in the form of a longitudinal wave, by an intensity corresponding to the voltage of the remaining signal part, into a material kept in contact with an outside surface of polymer film 8. In addition the radiation angle θ into the material is adjusted by filter 7. In short, it is possible not only to adjust the ultrasound power and the radiation angle θ into the material, but alto to sweep an ultrasound beam into the material.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. A device for ultrasound radiation into a material comprising:

a piezoelectric substrate having two end surfaces;

a first input interdigital transducer;

a second input interdigital transducer;

an output interdigital transducer, all said first input-, said second input-, and said output interdigital transducers being formed on one end surface of said piezoelectric substrate;

an amplifier; and a voltage controller, said first input interdigital transducer receiving an input electric signal and exciting a first elastic wave, composed of a leaky- and a non-leaky components, in said piezoelectric substrate, said output interdigital transducer detecting said non-leaky component of said first elastic wave as a delayed electric signal, said amplifier amplifying said delayed electric signal and feeding a signal part, as said input electric signal, of an amplified electric signal back to said first input interdigital transducer, again, said voltage controller controlling a voltage of a remaining signal part of said amplified electric signal, said second input interdigital transducer receiving said remaining signal part, exciting a second elastic wave, composed of a leaky- and a non-leaky components, in said piezoelectric substrate, and radiating said leaky component of said second elastic wave in the form of a longitudinal wave, by an intensity corresponding to said voltage of said remaining signal part, into a material through the other end surface of said piezoelectric substrate.

2. A device for ultrasound radiation into a material as defined in claim 1, wherein said piezoelectric substrate is made of a piezoelectric ceramic thin plate, the polarization axis thereof being parallel to the thickness direction thereof.

3. A device for ultrasound radiation into a material as defined in claim 1, wherein said piezoelectric substrate is made of a piezoelectric polymer thin plate.

4. A device for ultrasound radiation into a material as defined in claim 1 further comprising a filter for adjusting a frequency of said input electric signal.

5. A device for ultrasound radiation into a material as defined in claim 1 further comprising a polymer film, with which at least a surface part of said other end surface of said piezoelectric substrate is coated, said surface part corresponding to a surface part, including said second input interdigital transducer, of said one end surface of said piezoelectric substrate.

6. A device for ultrasound radiation into a material as defined in claim 1 further comprising a cap mounted on a surface part, in contact with air, of said other end surface of said piezoelectric substrate, said surface part corresponding to a surface part, including said first input- and said output interdigital transducers, of said one end surface of said piezoelectric substrate.

7. A device for ultrasound radiation into a material as defined in claim 1 further comprising:

a polymer film, with which at least a surface part of said other end surface of said piezoelectric substrate is coated, said surface part corresponding to a surface part, including said second input interdigital transducer, of said one end surface of said piezoelectric substrate; and a cap mounted on a remaining surface part, in contact with air, of said other end surface of said piezoelectric substrate.

8. A device for ultrasound radiation into a material comprising:

a piezoelectric substrate having two end surfaces;

an input interdigital transducer;

an output interdigital transducer;

an input interdigital-transducer group consisting of at least two interdigital transducers, said input- and said output interdigital transducers and said input interdigital-transducer group being formed on one end surface of said piezoelectric substrate;

an amplifier;

a voltage controller; and a switch, said input interdigital transducer receiving an input electric signal and exciting a first elastic wave, composed of a leaky- and a non-leaky components, in said piezoelectric substrate, said output interdigital transducer detecting said non-leaky component of said first elastic wave as a delayed electric signal, said amplifier amplifying said delayed electric signal and feeding a signal part, as said input electric signal, of an amplified electric signal back to said first input interdigital transducer, again, said voltage controller controlling a voltage of a remaining signal part of said amplified electric signal, said switch connecting said voltage controller with said at least two interdigital transducers in turn, each of said at least two interdigital transducers receiving said remaining signal part, exciting a second elastic wave, composed of a leaky- and a non-leaky components, in said piezoelectric substrate, and radiating said leaky component of said second elastic wave in the form of a longitudinal wave, by an intensity corresponding to said voltage of said remaining signal part, into a material through the other end surface of said piezoelectric substrate.

9. A device for ultrasound radiation into a material as defined in claim 8, wherein said piezoelectric substrate is made of a piezoelectric ceramic thin plate, the polarization axis thereof being parallel to the thickness direction thereof.

10. A device for ultrasound radiation into a material as defined in claim 8, wherein said piezoelectric substrate is made of a piezoelectric polymer thin plate.

11. A device for ultrasound radiation into a material as defined in claim 8 further comprising a filter for adjusting a frequency of said input electric signal.

12. A device for ultrasound radiation into a material as defined in claim 8 further comprising a polymer film, with which at least a surface part of said other end surface of said piezoelectric substrate is coated, said surface part corresponding to a surface part, including said input interdigital-transducer group, of said one end surface of said piezoelectric substrate.

13. A device for ultrasound radiation into a material as defined in claim 8 further comprising a cap mounted on a surface part, in contact with air, of said other end surface of said piezoelectric substrate, said surface part corresponding to a surface part, including said input- and said output interdigital transducers, of said one end surface of said piezoelectric substrate.

14. A device for ultrasound radiation into a material as defined in claim 8 further comprising:

a polymer film, with which at least a surface part of said other end surface of said piezoelectric substrate is coated, said surface part corresponding to a surface part, including said input interdigital-transducer group, of said one end surface of said piezoelectric substrate; and a cap mounted on a remaining surface part, in contact with air, of said other end surface of said piezoelectric substrate.

* * * * *